(12) United States Patent
Yoshida et al.

(10) Patent No.: US 7,772,704 B2
(45) Date of Patent: Aug. 10, 2010

(54) SEMICONDUCTOR DEVICE

(75) Inventors: Tetsuya Yoshida, Oura-Gun (JP);
Mitsuyuki Kobayashi, Gifu (JP)

(73) Assignees: Sanyo Electric Co., Ltd., Moriguchi-shi
(JP); Sanyo Semiconductor Co., Ltd.,
Gunma (JP); **Sanyo Semiconductor
Manufacturing Co., Ltd.**, Ojiya-shi (JP)

( * ) Notice: Subject to any disclaimer, the term of this
patent is extended or adjusted under 35
U.S.C. 154(b) by 325 days.

(21) Appl. No.: 11/845,473

(22) Filed: Aug. 27, 2007

(65) Prior Publication Data

US 2008/0061326 A1 Mar. 13, 2008

(30) Foreign Application Priority Data

Aug. 28, 2006 (JP) .............................. 2006-230730

(51) Int. Cl.
*H01L 23/52* (2006.01)
(52) U.S. Cl. ................ 257/762; 257/288; 257/E23.141
(58) Field of Classification Search ................ 257/288,
257/762, E23.141
See application file for complete search history.

(56) References Cited

U.S. PATENT DOCUMENTS 7,446,354 B2 * 11/2008 Loechelt et al. ............. 257/288

2003/0020174 A1 1/2003 Kohno
2008/0029906 A1 * 2/2008 Otremba ..................... 257/778

FOREIGN PATENT DOCUMENTS

JP 2002-368218 12/2002
JP 2003-045875 2/2003

OTHER PUBLICATIONS

Korean Office Action mailed Apr. 29, 2008, directed to counterpart
KR application No. 10-2007-0084882; 3 pages.

* cited by examiner

*Primary Examiner*—Sue Purvis
*Assistant Examiner*—Krista Soderholm
(74) *Attorney, Agent, or Firm*—Morrison & Foerster LLP

(57) ABSTRACT

As a discrete semiconductor chip, there has been known one
that enables flip-chip mounting by providing first and second
electrodes in a current path above a first surface of a semi-
conductor substrate. However, there is a problem that a hori-
zontal current flow in the substrate increases resistance com-
ponents. A first electrode and a second electrode, which are
connected to an element region, are provided above a first
surface. Moreover, a thick metal layer having corrosion resis-
tance and oxidation resistance and also having a low resis-
tance is provided above a second surface. Thus, resistance
components of a current flowing in a horizontal direction of a
substrate are reduced. Moreover, by appropriately selecting a
thickness of the thick metal layer, a resistance value of a
device can be reduced while suppressing a cost increase.
Furthermore, by adopting Au as the thick metal layer, defects
such as discoloration of the thick metal layer with time can be
prevented.

15 Claims, 12 Drawing Sheets

Prior Art

Prior Art

SEMICONDUCTOR DEVICE

BACKGROUND OF THE INVENTION

This invention claims priority from Japanese Patent Application No. 2006-230730 filed on Aug. 28, 2006, the content of which is incorporated herein by reference in its entirety.

1. Field of the Invention

The present invention relates to a semiconductor device, and more particularly relates to a semiconductor device which achieves higher reliability by reducing resistance of the device.

2. Description of the Related Art

In many discrete semiconductor devices (semiconductor chips), electrodes connected to an input terminal and an output terminal, respectively, are provided above the respective surfaces (front and rear surfaces) of the chip, respectively. Meanwhile, there has also been known a type of a semiconductor device having both electrodes provided above one surface of a chip to enable flip-chip mounting or the like.

With reference to FIG. 12, a conventional flip-chip mountable semiconductor device will be described by taking a MOSFET as an example.

On an n+ type semiconductor substrate 133, an n− type epitaxial layer is provided to obtain a drain region 134. In the drain region 134, a p type channel layer 135 is provided. Thereafter, a trench 136 that reaches the drain region 134 is formed from a surface of the channel layer 135. Subsequently, an inner wall of the trench 136 is covered with a gate oxide film 137, and a gate electrode 138 is provided in the trench 136. Thus, each cell 132 is formed. In the surface of the channel layer 135 adjacent to the trench 136, an n+ type source region 139 and a p+ type body region 140 are formed. The trench 136 is covered with an interlayer insulating film 141.

A source electrode 142 is provided by sputtering Al or the like so as to be connected to the source region 139 in each cell 132. A gate pad electrode 148 is an electrode formed in the same step as that of the source electrode 142 and allows the gate electrode to come into contact therewith by extending the gate electrode. A drain pad electrode 114 is an electrode formed in the same step as that of the source electrode 142 and is provided on an annular 115 in a periphery of the semiconductor chip.

A source bump electrode 111 is a solder bump which comes into contact with the source electrode 142. A contact hole is provided in a nitride film 156 on the source electrode 142, and a base electrode 110 to be a base for solder. Thereafter, the solder bump is formed thereon. A gate bump electrode 112 and a drain bump electrode 113 are also solder bumps provided in the same manner as the source bump electrode 111.

As a metal plate 116, a metal piece, such as Cu, Fe and Al, smaller than a chip size is attached to a rear surface of the semiconductor chip in accordance with coordinates for chip arrangement on a wafer. This metal plate 116 can reduce a drain resistance.

As described above, electrodes connected to all terminals, such as electrodes (source and drain electrodes) connected to an input terminal and an output terminal and, in this case, an electrode (gate electrode) connected to a control terminal, are provided above a first surface of a semiconductor substrate (semiconductor chip). Thus, the chip can be flip-chip mounted. This technology is described, for instance, in Japanese Patent Application Publication No. 2002-368218.

FIGS. 13A and 13B are views schematically showing arrangement of an electrode (for example, a source electrode S) connected to an input terminal IN and an electrode (for example, a drain electrode D) connected to an output terminal OUT and a resistance component of a current path formed in a substrate in a discrete MOSFET.

FIG. 13A shows the case where the source electrode S and the drain electrode D are provided on a first surface Sf1 and a second surface Sf2, respectively. FIG. 13B shows the case where both of the source electrode S and the drain electrode D are provided on the first surface Sf1.

As a substrate, a low-concentration semiconductor layer LS is laminated on a high-concentration semiconductor substrate HS. Moreover, in a surface of the low-concentration semiconductor layer LS, an element region e of the MOSFET is provided.

In the case of FIG. 13A, a current path is formed as indicated by the arrow, which reaches the drain electrode D on the second surface Sf2 from the source electrode S on the first surface Sf1 through the low-concentration semiconductor layer LS and the high-concentration semiconductor substrate HS. Therefore, in this case, a resistance component from the source electrode S toward the drain electrode D in the MOSFET is mainly set to be a resistance Ra in a depth (vertical) direction of the substrate.

In such a conventional power MOSFET, the drain electrode D is taken out from a rear surface (the second surface Sf2) of a semiconductor chip. Thus, the current path is formed in the depth (vertical) direction of the substrate. Therefore, in this case, the drain electrode D on the rear surface is formed to have a thickness as small as possible in order to further reduce a drain resistance.

For example, Ti that improves adhesion and Ni that prevents diffusion of solder toward Si are formed to have thicknesses of 500 Å and 5000 Å, respectively. Thereafter, Au is formed to have a thickness of 500 Å.

In the case where the semiconductor chip described above is to be, for example, flip-chip mounted, it is necessary to provide the drain electrode D on the same plane as the source electrode S. In this case, a current path is formed from the source through the substrate to the drain. However, if a metal layer (the drain electrode D) on the rear surface still has a small thickness as shown in FIG. 13A, a resistance value is increased.

Meanwhile, FIG. 13B shows a structure suitable for flip-chip mounting and shows, for example, the case of the conventional structure shown in FIG. 12. In such a structure in which the source electrode S and the drain electrode D are provided on the first surface Sf1 of the chip, a current path is formed as indicated by the arrows, which reaches the low-concentration semiconductor layer LS and the high-concentration semiconductor substrate HS from the source electrode S on the first surface Sf1 and then reaches the drain electrode D from the low-concentration semiconductor layer LS again. Therefore, in this case, a resistance component from the source electrode S toward the drain electrode D in the MOSFET is set to be a resistance obtained by combining resistances Ra and Rc in a vertical direction of the substrate and a resistance Rb in a horizontal direction of the substrate. Therefore, when compared with FIG. 13A, the resistance Rb in the horizontal direction of the substrate also significantly affects the resistance of the entire device.

Consequently, in order to reduce the resistance Rb, the metal plate 116 (see FIG. 12) having a low resistance is provided on the second surface Sf2 (rear surface) of the substrate. The metal plate is made of, for example, Cu, Fe, Al, Ag or the like.

Cu, Fe, Al or Ag is adopted since those metals are inexpensive and realize a low resistance value of the metal plate 116 itself. However, all of those metals have low oxidation resistance and corrosion resistance. Thus, for example, long-term storage thereof may oxidize and discolor the metal plate. The discoloration of the metal plate adversely affects the resistance value of the metal plate and deteriorates adhesion to a dicing sheet in an assembly operation. Thus, the discoloration is a significant factor that causes trouble such as chip scattering in a dicing operation.

SUMMARY OF THE INVENTION

The invention provides an semiconductor device that includes a semiconductor substrate comprising a first surface and a second surface, a discrete semiconductor element formed in the semiconductor substrate, a first electrode and a second electrode that are disposed on the first surface and connected with the discrete semiconductor element, a first metal layer formed on the second surface so as to form an uppermost layer covering the second surface, and a second metal layer disposed between the first metal layer and the second surface of the semiconductor substrate, wherein a current path is configured to be formed between the first and second electrodes through the semiconductor substrate and the first and second metal layers upon application of voltages to the first and second electrodes, the first metal layer is thicker than the second metal layer, and the first metal layer has a higher degree of corrosion resistance or oxidation resistance than the second metal layer.

The invention also provides an semiconductor device that includes a semiconductor substrate comprising a first surface and a second surface, a discrete semiconductor element formed in the semiconductor substrate, a first electrode and a second electrode that are disposed on the first surface and connected with the discrete semiconductor element, a first metal layer formed on the second surface so as to form an uppermost layer covering the second surface, a second metal layer disposed between the first metal layer and the second surface of the semiconductor substrate, and a third metal layer disposed between the second metal layer and the first metal layer, wherein a current path is configured to be formed between the first and second electrodes through the semiconductor substrate and the first, second and third metal layers upon application of voltages to the first and second electrodes, the first metal layer is thinner than the third metal layer, and the first metal layer has a higher degree of corrosion resistance or oxidation resistance than the third metal layer.

The invention also provides an semiconductor device that includes a semiconductor substrate comprising a first surface and a second surface, a first discrete semiconductor element of insulating gate type formed in the semiconductor substrate, a second discrete semiconductor element of insulating gate type formed in the semiconductor substrate, a drain region that is part of the substrate and operates as a drain common to the first and second discrete semiconductor elements, a first source electrode and a second source electrode that are disposed on the first surface and connected with the first and second discrete semiconductor elements, respectively, a first metal layer formed on the second surface so as to form an uppermost layer covering the second surface, and a second metal layer disposed between the first metal layer and the second surface of the semiconductor substrate, wherein a current path is configured to be formed between the first and second source electrodes through the semiconductor substrate and the first and second metal layers upon application of voltages to the first and second source electrodes, the first metal layer is thicker than the second metal layer, and the first metal layer has a higher degree of corrosion resistance or oxidation resistance than the second metal layer.

The invention also provides an semiconductor device that includes a semiconductor substrate comprising a first surface and a second surface, a first discrete semiconductor element of insulating gate type formed in the semiconductor substrate, a second discrete semiconductor element of insulating gate type formed in the semiconductor substrate, a drain region that is part of the substrate and operates as a drain common to the first and second discrete semiconductor elements, a first source electrode and a second source electrode that are disposed on the first surface and connected with the first and second discrete semiconductor elements, respectively, a first metal layer formed on the second surface so as to form an uppermost layer covering the second surface, a second metal layer disposed between the first metal layer and the second surface of the semiconductor substrate, and a third metal layer disposed between the second metal layer and the first metal layer, wherein a current path is configured to be formed between the first and second source electrodes through the semiconductor substrate and the first, second and third metal layers upon application of voltages to the first and second source electrodes, the first metal layer is thinner than the third metal layer, and the first metal layer has a higher degree of corrosion resistance or oxidation resistance than the third metal layer.

DESCRIPTION OF THE EMBODIMENTS

With reference to FIGS. 1 to 11, embodiments of the present invention will be described in detail.

A semiconductor device of the embodiments of the present invention includes a semiconductor substrate, an element region, a first electrode, a second electrode, a first metal layer and a second metal layer. The first and second electrodes are provided above a first surface of the semiconductor substrate.

Moreover, a current path is formed, which reaches the second electrode from the first electrode through the semiconductor substrate.

In the element region, a discrete semiconductor element is formed. A discrete semiconductor element is also called an individual semiconductor and is a collective term for single-function semiconductor elements. Examples of the discrete semiconductor elements are a field-effect transistor (FET) typified by a MOSFET (Metal Oxide Semiconductor Field Effect Transistor), an IGBT (Insulated Gate Bipolar Transistor) and a junction FET, a bipolar transistor, a diode, a thyristor and the like.

With reference to FIGS. 1 to 4, description will be given of the case where the first metal layer is a thick metal layer, as a first embodiment. Moreover, in the first embodiment, description will be given by taking the case where a MOSFET is formed in the element region, as an example.

Figure 1:
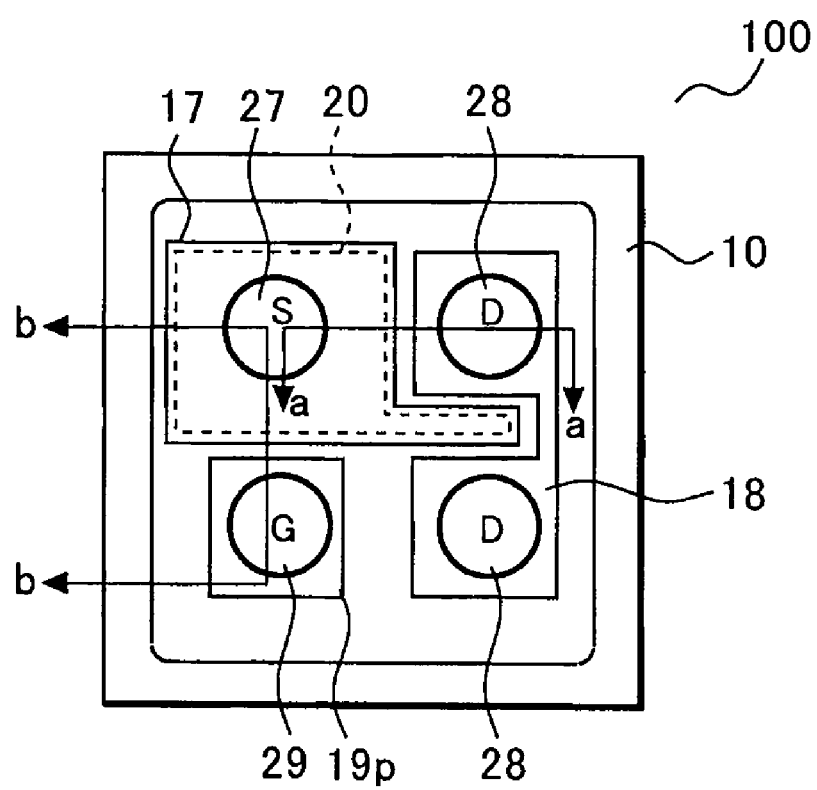
FIG. 1 is a plan view showing a semiconductor device of a first embodiment of the present invention.

FIG. 1 is a plan view showing a MOSFET 100 in the first embodiment. FIG. 1 shows respective electrodes and external connection electrodes in the MOSFET 100.

On a surface of a semiconductor substrate 10, a source electrode 17, a drain electrode 18 and a gate pad electrode 19*p* connected to an element region 20 (broken line) are provided. On the source electrode 17, the drain electrode 18 and the gate pad electrode 19*p*, a source bump electrode 27, drain bump electrodes 28 and a gate bump electrode 29 to be external connection electrodes as indicated by circles are provided, respectively. Each of the bump electrodes 27 to 29 has a diameter of, for example, about 250 μm. The semiconductor substrate 10 is a semiconductor chip having a size of 1.4 mm×1.4 mm as an example. A pitch between the respective bump electrodes 27 to 29 is about 0.5 mm to 1.0 mm.

Note that, although FIG. 1 shows the four bump electrodes 27 to 29 in total, the number and arrangement thereof are not limited to those shown in FIG. 1. Moreover, the number of the respective bump electrodes 27 to 29 is not limited to that shown in FIG. 1.

Figure 2:
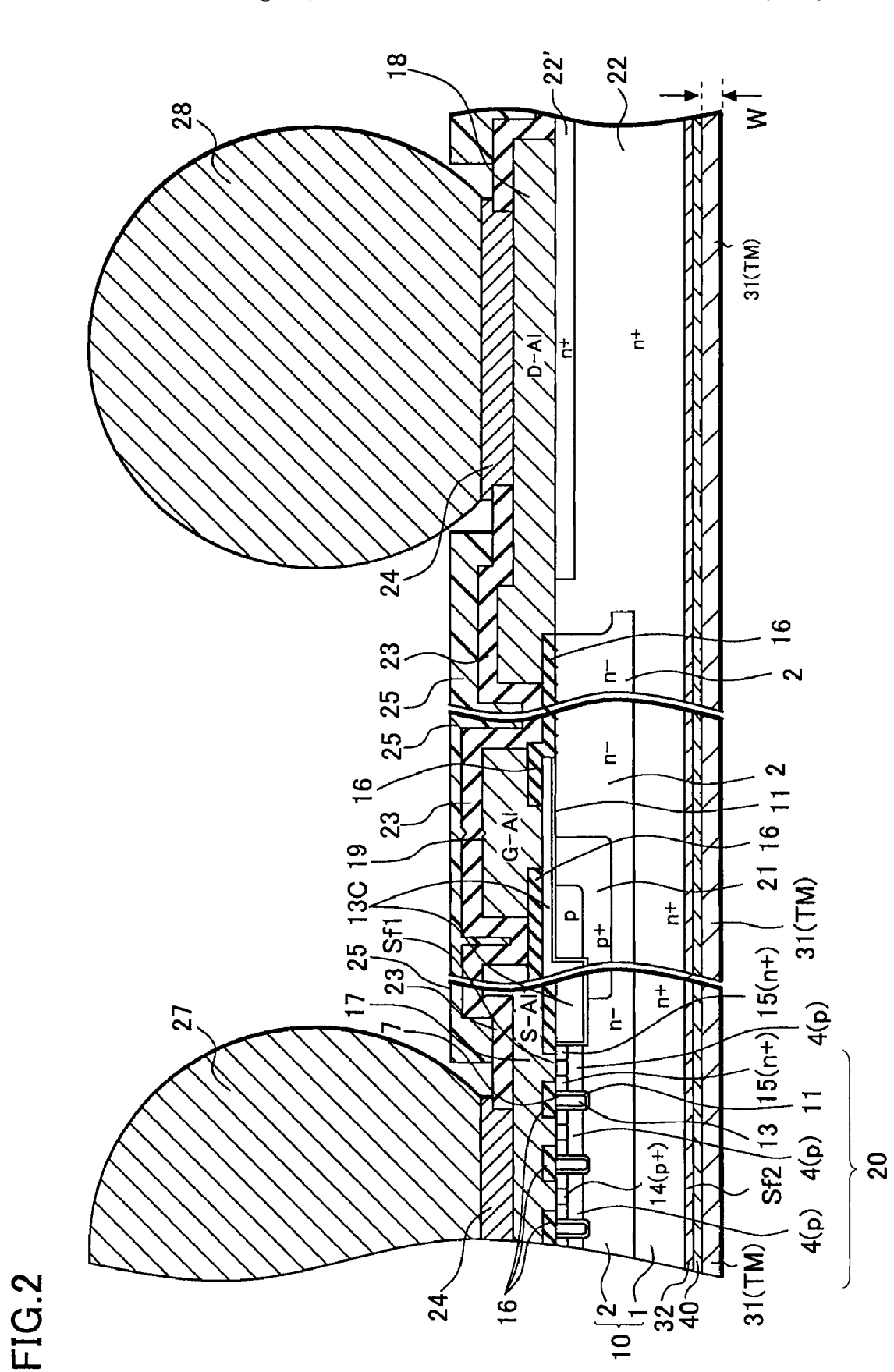
FIG. 2 is a cross-sectional view showing the semiconductor device of the first embodiment of the present invention.

FIG. 2 is a cross-sectional view along the line a-a in FIG. 1, showing the MOSFET 100 according to the first embodiment. The semiconductor substrate 10 has a first surface Sf1 and a second surface Sf2, and the element region 20 of the MOSFET 100 is provided.

Specifically, as the semiconductor substrate 10, an n− type semiconductor layer (for example, an n− type epitaxial layer) 2 is provided on an n+ type silicon semiconductor substrate 1 to obtain a drain region. In a surface of the n− type semiconductor layer 2 to be the first surface Sf1, a channel layer 4 that is a p type impurity region is provided.

Trenches 7 penetrate the channel layer 4 and reach the n− type semiconductor layer 2. The trenches 7 are generally patterned into a lattice shape or a stripe shape in a planar pattern of the first surface Sf1.

On an inner wall of each of the trenches 7, a gate oxide film 11 is provided. A thickness of the gate oxide film 11 is set to about several hundred Å according to a drive voltage of the MOSFET. Moreover, a gate electrode 13 is provided by burying a conductive material in the trench 7. The conductive material is, for example, polysilicon, and n type impurities, for example, are introduced into the polysilicon to lower a resistance.

Source regions 15 are n+ type impurity regions obtained by injecting n type impurities into a surface of the channel layer 4 adjacent to the trenches 7. Moreover, in the surface of the channel layer 4 between the source regions 15 adjacent to each other, a body region 14 that is a p+ type impurity diffusion region is provided to stabilize a potential of the substrate. Thus, a portion surrounded by the trenches 7 adjacent to each other is set to be one of cells in a MOS transistor. Accordingly, a number of the cells are gathered to form the element region 20 in the MOSFET.

Note that, in this embodiment, for convenience, description will be given of the case where the element region 20 is up to an arrangement region of an outermost cell in the MOS transistor. In a periphery of the element region 20, a guard ring 21 that is a high-concentration p type impurity region is provided.

The gate electrode 13 is covered with an interlayer insulating film 16, and the source electrode 17 is a metal electrode obtained by sputtering aluminum (Al) or the like to be patterned into a desired shape. The source electrode 17 is provided above the first surface Sf1 of the semiconductor substrate 10 so as to cover the element region 20, and is connected to the source regions 15 and the body regions 14 through contact holes between the interlayer insulating films 16.

The gate electrode 13 is extracted onto the substrate by a connection part 13*c*, is extended to a gate connection electrode 19 surrounding the semiconductor substrate, and is connected to a gate pad electrode (not shown here).

A nitride film 23 is provided on the source electrode 17, and a UBM (Under Bump Metal) 24 is provided by forming an opening in a predetermined region of the nitride film 23. The UBM 24 is a metal layer obtained by laminating nickel (Ni: thickness of 2.4 μm) and gold (Au: thickness of 500 Å) in this order from the semiconductor substrate 10 by electroless plating, for example. On the nitride film 23, a solder resist 25 is provided, from which the UBM 24 is exposed. Thereafter, the source bump electrode 27 is provided by screen printing using the UBM 24 as a base electrode. The source bump electrode 27 has a diameter of about 250 μm. Note that, for convenience of description, FIG. 2 shows the case where the source electrode 17 is disposed on an end of the element region 20. However, the source electrode is actually disposed so as to evenly apply a source potential to the element region 20.

As shown in FIG. 2, the drain electrode 18 is provided above the first surface Sf1 of the semiconductor substrate 10. The drain electrode 18 is formed of the same (for example, Al) metal layer as that of the source electrode 17 and patterned into a desired shape. Moreover, the drain electrode 18 is disposed so as to be separated from the source electrode 17. On the drain electrode 18, the drain bump electrode 28 is provided in the same manner as the source bump electrode 27.

Below the drain electrode 18, an n type high-concentration impurity region (n+ type impurity region) 22 and an n+ type impurity region 22' having a concentration higher than that of the n+ type impurity region 22 are provided to reduce a drain resistance. The n+ type impurity region 22 reaches the n+ type silicon semiconductor substrate 1 from the surface of the n− type semiconductor layer 2. Specifically, the drain electrode 18 is connected to the drain region (the n− type semiconductor layer 2 and the n+ type silicon semiconductor substrate 1) in the element region 20 through the n+ type impurity region 22.

As described above, in this embodiment, both of the source electrode 17 and the drain electrode 18 are provided above the first surface Sf1. Thus, when the MOSFET 100 is operated, a current path is formed, which reaches the drain electrode 18 and the drain bump electrode 28, which are connected to an output terminal, from the source bump electrode 27 and the source electrode 17, which are connected to an input terminal, through the element region 20, the n− type semiconductor layer 2, the n+ type silicon semiconductor substrate 1 and the n+ type impurity region 22 (22').

Figure 3:
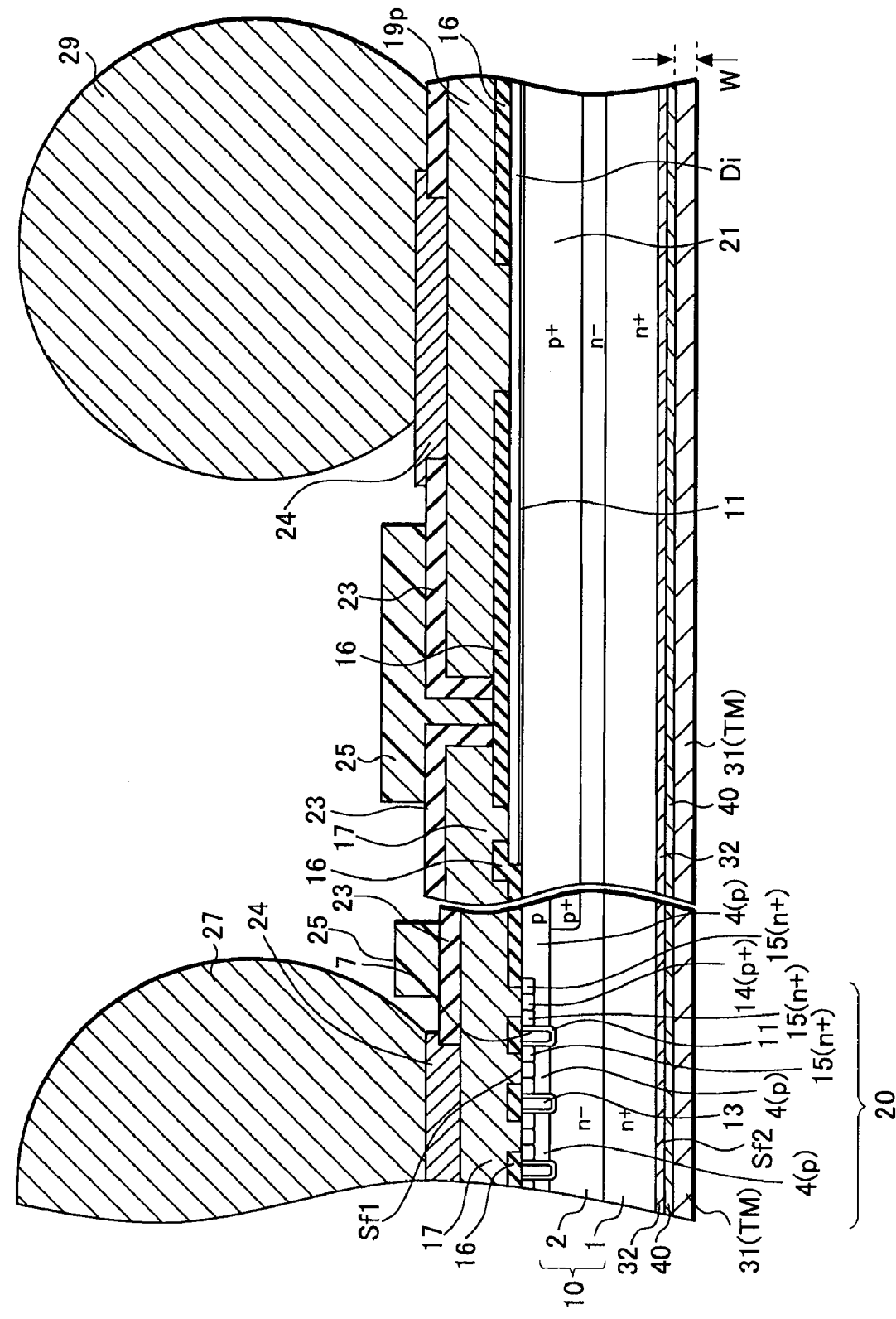
FIG. 3 is a cross-sectional view showing the semiconductor device of the first embodiment of the present invention.

FIG. 3 is also a cross-sectional view along the line b-b in FIG. 1, showing the MOSFET 100 according to the first embodiment.

The gate pad electrode 19p is provided on a protection diode Di and connected to one end thereof. The other end of the protection diode Di is connected to the source electrode 17. As shown in FIG. 2, the gate pad electrode 19p is connected to the gate electrode 13 through the gate connection electrode 19 and the connection part 13c. On the gate pad electrode 19p, the gate bump electrode 29 is provided in the same manner as the source bump electrode 27. Accordingly, a gate voltage is applied to the gate electrode 13.

With reference to FIGS. 2 and 3, a first metal layer 31 having corrosion resistance and oxidation resistance is exposed to the entire uppermost surface of the second surface Sf2 of the semiconductor substrate 10. Moreover, a second metal layer 32 is provided between the first metal layer 31 and the semiconductor substrate 10.

The first metal layer 31 is a metal layer having corrosion resistance and oxidation resistance and is made of, for example, gold (Au). Moreover, the first metal layer 31 is a thick metal layer TM having a thickness larger than that of the second metal layer 32. The thickness W of the thick metal layer TM is set around a lower limit at which a resistance value of the current path described above is saturated in a correlation between the thickness W of the thick metal layer TM and the resistance value of the current path. Although the correlation will be described later, 6000 Å is adopted as the thickness W of the thick metal layer TM as an example in this embodiment.

On a surface of the thick metal layer 31, no protective film is provided. Thus, the thick metal layer 31 is exposed to the uppermost surface of the second surface Sf2 of the semiconductor substrate 10.

The second metal layer 32 is a metal layer (for example, titanium (Ti)) provided on the second surface Sf2 to improve adhesion to silicon. In this case, the second metal layer 32 has a thickness of, for example, 500 Å.

Between the first metal layer 31 (the thick metal layer TM) and the second metal layer 32, another metal layer (for example, nickel (Ni)) 40 may be provided as shown in FIGS. 2 and 3. Specifically, a multilayer metal structure on the second surface Sf2 includes the Ti, Ni and Au layers stacked in this order from the semiconductor substrate 10. Moreover, the another metal layer (Ni) 40 has a thickness of, for example, 5000 Å.

Moreover, although not shown in FIGS. 2 and 3, a copper (Cu) layer may be further provided as yet another metal layer. Accordingly, the multilayer metal structure on the second surface Sf2 includes Ti (500 Å), Ni (5000 Å), Cu (1500 Å) and Au (6000 Å) layers stacked in this order from the semiconductor substrate 10.

As described above, the multilayer metal structure on the second surface Sf2 in the first embodiment is one including at least the second metal layer 32 and the first metal layer 31 (the thick metal layer TM). Moreover, the first and second metal layers are provided by metal evaporation and the like above the second surface Sf2 before formation of the respective the bump electrodes.

Figure 4:
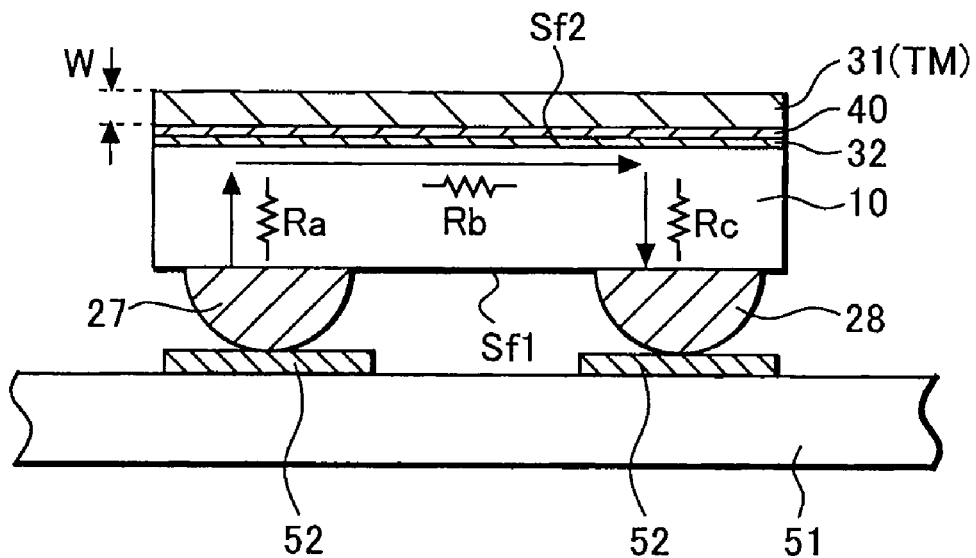
FIG. 4 is a side view showing the semiconductor device of the first embodiment of the present invention.

FIG. 4 is a side view showing a state where the semiconductor substrate (semiconductor chip) 10 described above is flip-chip mounted on a printed board or the like as a mounting example thereof. Note that the element region 20 of the semiconductor substrate 10 and the like are omitted from FIG. 4.

On a printed board 51 having predetermined conductive patterns 52 provided thereon, the semiconductor chip 10 is disposed face down. Thereafter, the source bump electrode 27, the drain bump electrode 28 and the gate bump electrode (not shown here) are aligned with the conductive patterns 52 corresponding thereto. Subsequently, the conductive patterns 52 and the bump electrodes 27 to 29 are bonded and connected to each other by solder reflow using heat or by ultrasonic vibration in a pressurized state.

Figure 13A:
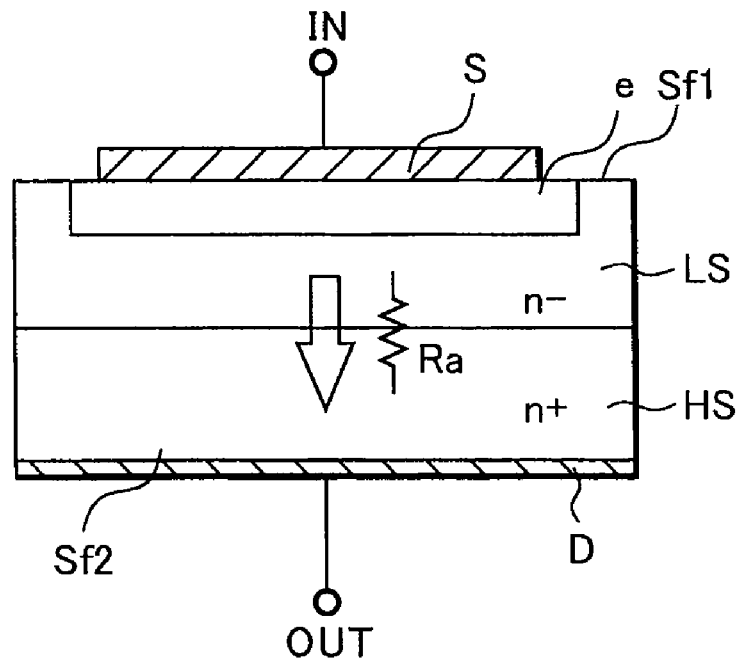
FIGS. 13A and 13B are cross-sectional views showing a conventional semiconductor device.
Figure 13B:
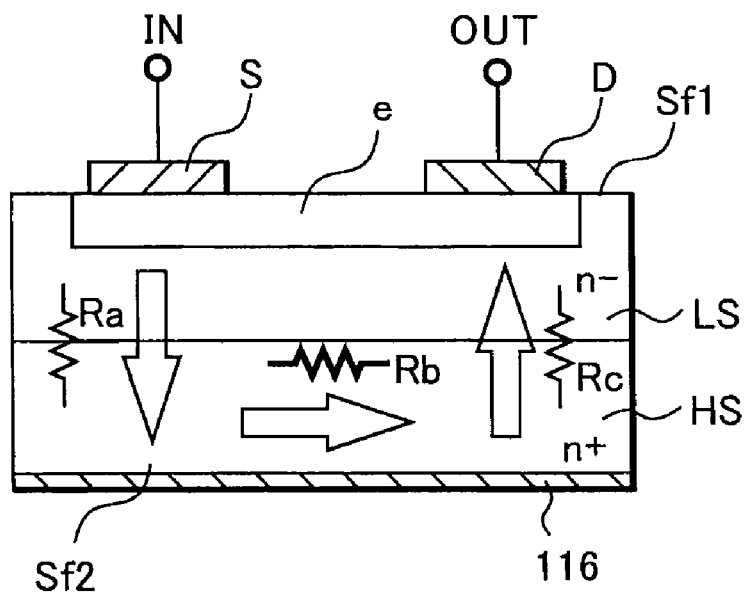

As described above, in this embodiment, the source electrode (the source bump electrode 27) connected to the input terminal and the drain electrode (the drain bump electrode 28) connected to the output terminal are provided above the first surface Sf1. Therefore, when the MOSFET 100 is operated, a current path is formed as indicated by the arrows in FIG. 4, which mainly passes through the semiconductor substrate 10 from the source electrode (the source bump electrode 27) and reaches the drain electrode (the drain bump electrode 28). Moreover, a resistance in the current path includes resistances Ra and Rc in a vertical direction of the semiconductor substrate 10 and a resistance Rb in a horizontal direction thereof (see FIG. 13B).

Specifically, in the structure of this embodiment, the resistance Rb that is a resistance component in the horizontal direction of the substrate is generated. Thus, it is preferable that the resistance Rb be reduced as much as possible. Therefore, the thick metal layer TM having a thickness of 6000 Å is disposed above the second surface Sf2. As the thick metal layer TM, gold (Au) is adopted. Since the thick metal layer TM has a low resistance value and a large thickness, the resistance Rb in the horizontal direction of the substrate can be reduced.

Furthermore, Au has corrosion resistance and oxidation resistance higher than those of silver (Ag) and copper (Cu), for example. Hence, by adopting Au as the first metal layer 31 exposed to the uppermost surface of the second surface Sf2, occurrence of defects such as discoloration and corrosion of the thick metal layer TM can be significantly suppressed even if the semiconductor chip (or in a wafer state) is stored for a long period of time.

For example, if the first metal layer 31 is discolored in the wafer state, adhesion to a dicing sheet in an assembly operation step is deteriorated. Thus, the discoloration is a significant factor that causes trouble such as chip scattering in a dicing operation.

Moreover, even after dicing, an increase in the resistance value of the first metal layer 31 itself that is the thick metal layer TM due to the discoloration or the like causes a problem that the first metal layer 31 cannot sufficiently contribute to reduction in the resistance in the horizontal direction of the substrate.

However, in this embodiment, by adopting Au having high corrosion resistance and oxidation resistance as the first metal layer 31 (the thick metal layer TM) to be the uppermost surface of the second surface Sf2, high reliability can be obtained without even having to additionally provide a protective film or the like for protecting the first metal layer 31.

Figure 5:
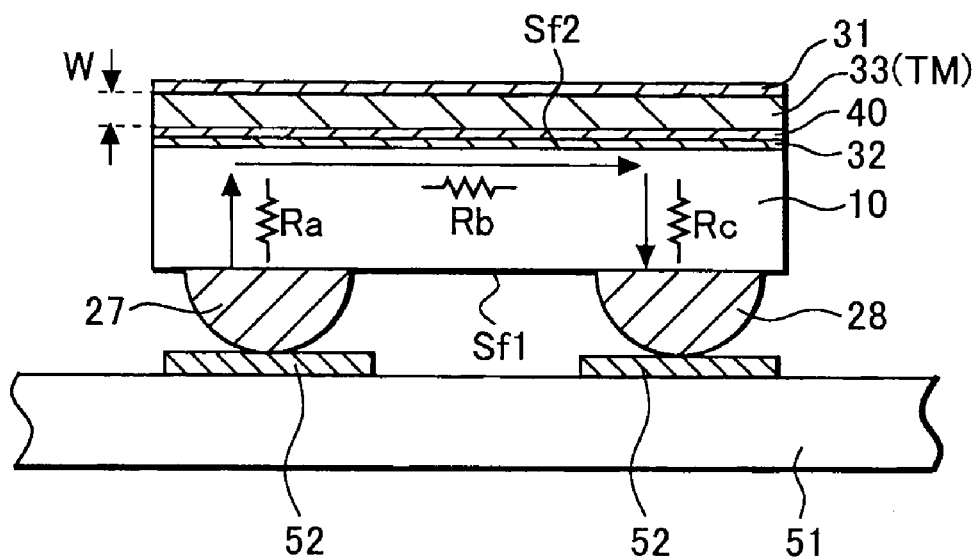
FIG. 5 is a side view showing a semiconductor device of a second embodiment of the present invention.

FIG. 5 is a side view of a second embodiment of the present invention, showing a state where a semiconductor substrate (semiconductor chip) 10 is flip-chip mounted on a printed board or the like as a mounting example thereof as in the case of FIG. 4. The second embodiment is different from the first embodiment in a multilayer metal structure on a second surface Sf2. Since an element region 20, a source electrode 17, a drain electrode 18 and the like provided on the semiconductor substrate 10 are the same as those shown in FIGS. 1 to 3, detailed description and illustration thereof will be omitted. Moreover, the same constituent components as those shown in FIG. 4 are denoted by the same reference numerals.

In the second embodiment, a metal layer structure on the second surface Sf2 is a multilayer metal structure including at least a first metal layer 31, a second metal layer 32 and a third metal layer 33.

The first metal layer 31 is a metal layer (for example, Au) which is provided on an uppermost surface of the second surface Sf2 and has corrosion resistance and oxidation resistance. The first metal layer 31 has a thickness of, for example, 500 Å. Moreover, on the second surface Sf2 of the semiconductor substrate 10, the second metal layer 32 (for example, Ti: thickness of 500 Å) which improves adhesion is provided.

The third metal layer 33 is an inexpensive metal layer, for example, Cu, which is provided between the second metal layer 32 and the first metal layer 31 and has a low resistance value. Moreover, in the second embodiment, the third metal layer 33 is set to be a thick metal layer TM. The third metal layer 33 has a thickness of, for example, 6000 Å.

Moreover, between the third metal layer 33 and the second metal layer 32, another metal layer (for example, Ni: thickness of 5000 Å) 40 may be provided as shown in FIG. 5.

Specifically, the multilayer metal structure on the second surface Sf2 includes the Ti, Ni, Cu and Au layers stacked in this order from the semiconductor substrate 10.

In the second embodiment, the third metal layer 33 is provided as the thick metal layer TM and Cu is adopted for the third metal layer 33. Moreover, the first metal layer 31 is provided on the uppermost surface of the second surface Sf2 and Au is adopted for the first metal layer 31. Thus, it is possible to reduce a resistance Rb in a horizontal direction of the substrate 10 and to significantly suppress occurrence of defects such as discoloration and corrosion of the uppermost surface of the second surface Sf2.

Furthermore, even if the thickness of the first metal layer 31 (Au) to be the uppermost surface of the second surface Sf2 is reduced, an on-resistance can be reduced by the thick metal layer TM (the third metal layer 33). Thus, a cost increase can be avoided compared with the first embodiment.

Moreover, a melting point of Au that is the first metal layer 31 is 1063° C. Specifically, when Ti (melting point: 1668° C.) is adopted for the second metal layer 32 and Cu (melting point: 1083° C.) is adopted for the third metal layer 33 in the second embodiment, a melting point of the multilayer metal structure on the second surface Sf2 is set to 1000° C. or higher in both of the first and second embodiments.

For example, in the case of flip-chip mounting as shown in FIGS. 4 and 5, a product name, a date of manufacture and the like are laser-printed (imprinted) on the uppermost surface (the surface of the first metal layer 31) of the mounted substrate. In this embodiment, all the metal layers on the second surface Sf2 have the melting point of 1000° C. or higher. Thus, resistance to high-temperature laser printing can also be enhanced. Therefore, disappearance of the thick metal layer TM (the first metal layer 31 or the third metal layer 33) can be minimized. Consequently, it is possible to prevent a variation in the on-resistance and water intrusion from a disappeared portion.

Note that, in this embodiment, the flip-chip mounting has been described as the mounting example of the semiconductor substrate (semiconductor chip) 10. However, according to this embodiment, the resistance of the device can be reduced when two electrodes on the current path are disposed above the first surface Sf1 in the discrete semiconductor. Accordingly, without being limited to the above example, mounting can be similarly executed by use of a COB (Chip on Board) technology.

In mounting by use of the COB technology, a second surface Sf2 side is fixed to a board such as a printed board, and electrodes above a first surface Sf1 are connected to conductive patterns on the board by use of bonding wires and the like. Moreover, a conductive or insulating adhesive is adopted for fixing of the second surface Sf2 side to the board.

Particularly, when the insulating adhesive is adopted, there is an increasing demand for reduction of the resistance in the semiconductor substrate 1. However, this embodiment enables efficient reduction in the resistance of the device.

Next, with reference to FIGS. 6 to 9, a third embodiment of the present invention will be described. Note that the same constituent components as those in the first embodiment are denoted by the same reference numerals, and redundant description thereof will be omitted.

As an element region 20 provided in a semiconductor substrate (semiconductor chip) 10, a plurality of element regions may be provided as long as the element regions are discrete (single-function) semiconductors. In the third embodiment, description will be given by taking, as an example, the case where two element regions 20a and 20b of first and second MOSFETs 100a and 100b are integrated in one semiconductor substrate (semiconductor chip) 10 while using a common drain.

As a semiconductor device for the purpose of switching, there has been known a device which not only switches between on and off but also switches a current path direction (direction in which a current flows), such as a MOSFET adopted in a protection circuit for a secondary battery (LIB: Lithium Ion Battery), for example.

Figure 6:
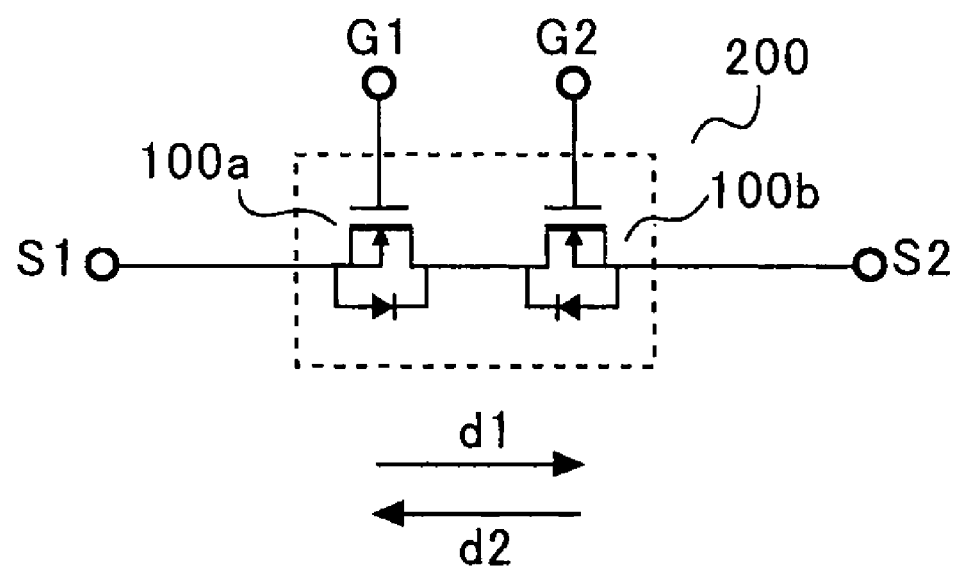
FIG. 6 is a circuit diagram showing a semiconductor device of a third embodiment of the present invention.

FIG. 6 is a circuit diagram showing an example of the case where a semiconductor device (switching element) which can switch a current path in two directions is formed of MOSFETs.

In a switching element 200, the first MOSFET 100a and the second MOSFET 100b, each of which includes a number of MOS transistor cells, are series-connected while using a common drain D. Moreover, gate signals are applied to respective gate terminals G1 and G2 to control the both MOSFETs. Furthermore, a current path is switched according to a difference between potentials applied to first and second source terminals S1 and S2.

The first and second MOSFETs 100a and 100b have respective parasitic diodes. For example, the first MOSFET 100a is turned off and the second MOSFET 100b is turned on by a control signal. Moreover, by setting the potential applied to the first source terminal S1 higher than that applied to the second source terminal S2, a current path in a direction d1 is formed by the parasitic diode in the first MOSFET 100a and the second MOSFET 100b.

Moreover, the first MOSFET 100a is turned on and the second MOSFET 100b is turned off by a control signal. Furthermore, by setting the potential applied to the first source terminal S1 lower than that applied to the second source terminal S2, a current path in a direction d2 is formed by the first MOSFET 100a and the parasitic diode in the second MOSFET 100b.

Furthermore, by turning on both of the gate terminals G1 and G2, the current path is formed without using the parasitic diodes.

Figure 7:
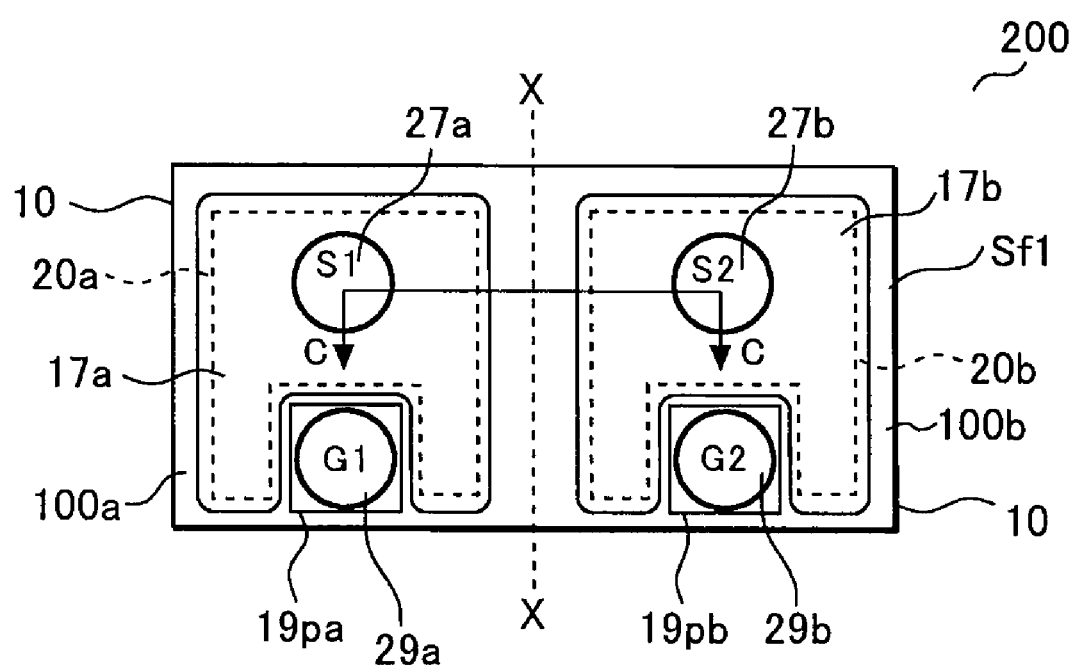
FIG. 7 is a plan view showing the semiconductor device of the third embodiment of the present invention.

FIG. 7 is a plan view showing the switching element 200 described above. FIG. 7 shows respective electrodes and external connection electrodes in the switching element 200.

The first and second element regions 20a and 20b are provided on the same semiconductor substrate 10. The first element region 20a is an element region for the first MOSFET 100a, and the second element region 20b is an element region for the second MOSFET 100b.

The first and second MOSFETs 100a and 100b are disposed, for example, linearly symmetrically about a center line X-X of the chip. Moreover, in the respective MOSFETs, first and second source electrodes 17a and 17b and first and second gate pad electrodes 19pa and 19pb are provided.

A source region (not shown) in the first MOSFET 100a is connected to the first source electrode 17a which covers the first element region 20a. On the first source electrode 17a, a first source bump electrode 27a is provided. A gate electrode (not shown) in the first MOSFET 100a is extended to a peripheral part of the semiconductor substrate 10 and connected to the first gate pad electrode 19pa. The same goes for the second MOSFET 100b.

Figure 8:
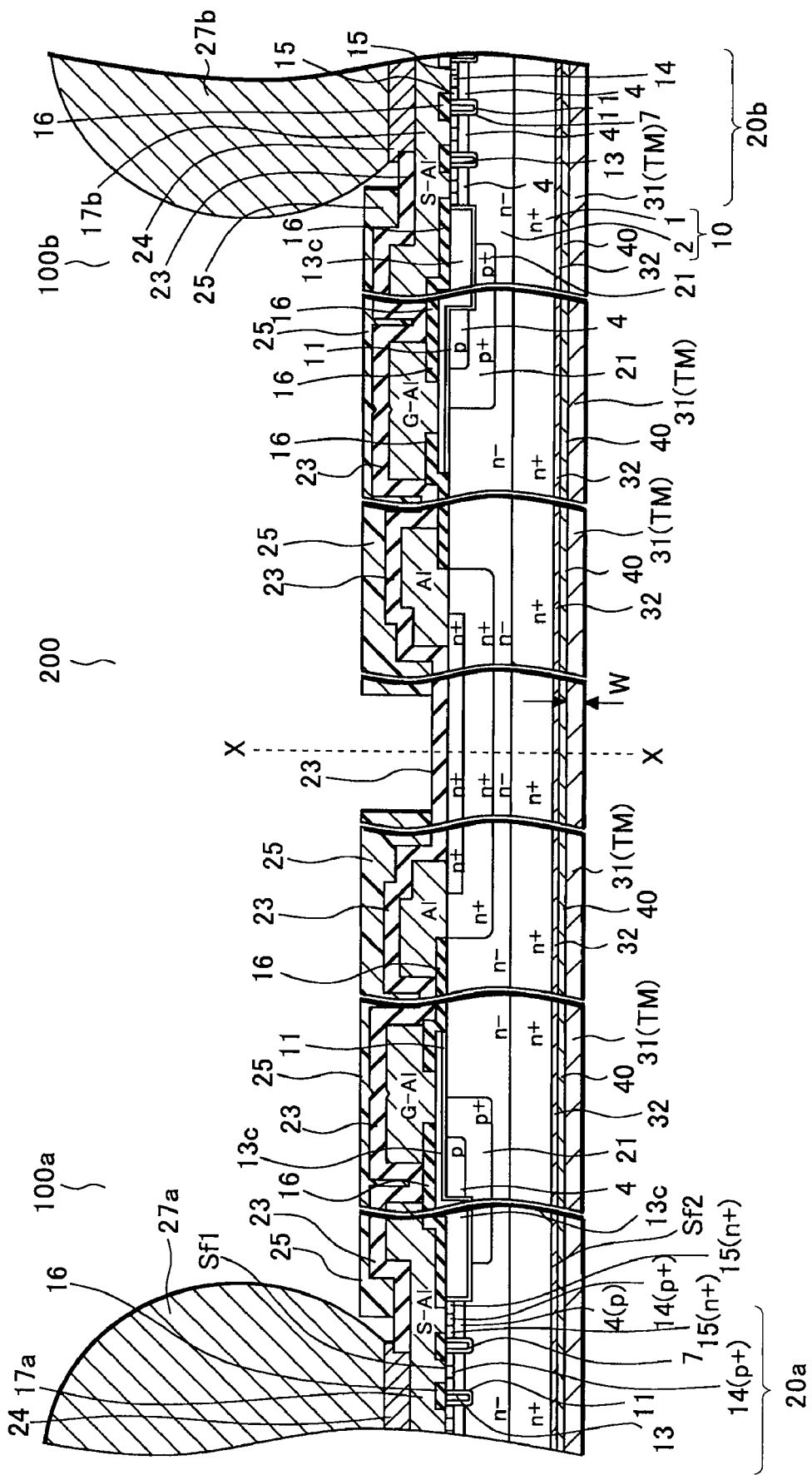
FIG. 8 is a cross-sectional view showing the semiconductor device of the third embodiment of the present invention.

FIG. 8 is a cross-sectional view along the line c-c in FIG. 7.

The first and second MOSFETs 100a and 100b are provided on the same semiconductor substrate 10 having a first surface Sf1 and a second surface Sf2. Specifically, the first MOSFET 100a is provided in the first element region 20a of the semiconductor substrate 10, and the second MOSFET 100b is provided in the second element region 20b thereof. Thus, a common drain region is set for the first and second MOSFETs 100a and 100b.

The MOS transistors included in the respective element regions 20a and 20b are the same as those in the first embodiment, and thus description thereof will be omitted. Meanwhile, in the third embodiment, a drain terminal is not extended to the outside and no drain electrode is provided.

Specifically, above the first surface Sf1, only the first source electrode 17a, the first gate pad electrode 19pa, the second source electrode 17b and the second gate pad electrode 19pb are provided. Moreover, the first source bump electrode 27a, a first gate bump electrode 29a, a second source bump electrode 27b and a second gate bump electrode 29b which are connected to those described above, respectively, are provided (see FIG. 7). A specific structure of those electrode portions is the same as that of the first embodiment. Moreover, the first and second MOSFETs 100a and 100b have the same configuration.

As described above, in the third embodiment, the first source electrode 17a and the second source electrode 17b are set to be a first electrode and a second electrode, both of which are provided above the first surface Sf1 of the semiconductor substrate 10. Moreover, between the first and second electrodes, a current path is formed.

To be more specific, for example, the first MOSFET 100a is turned off and the second MOSFET 100b is turned on by control signals applied to the first and second gate pad electrodes 19pa and 19pb. In this event, by setting a potential of the first source electrode 17a higher than that of the second source electrode 17b, a current path is formed in the direction d1 shown in FIG. 6. Meanwhile, when the potential of the first source electrode 17a is set lower than that of the second source electrode 17b by turning on the first MOSFET 100a and turning off the second MOSFET 100b by control signals, a current path is formed in the direction d2 opposite to the direction d1. Moreover, by turning on both of the first and second MOSFETs 100a and 100b, a current path is formed in the direction d1 or d2 without using parasitic diodes by a potential difference between the first and second source electrodes 17a and 17b.

Specifically, in the third embodiment, the current path is formed in a direction to the second source electrode 17b in the second MOSFET 100b from the first source electrode 17a in the first MOSFET 100a through the semiconductor substrate 10 (or in a direction opposite thereto).

In the third embodiment, a thick metal layer TM is provided as a first metal layer 31 above the second surface Sf2 of the semiconductor substrate 10 described above. Specifically, a second metal layer 32 (for example, Ti: 500 Å) for improving adhesion is provided on the second surface Sf2 of the semiconductor substrate 10. Thereafter, the first metal layer 31 (the thick metal layer TM) is provided, which is exposed to the uppermost surface of the second surface Sf2 side. Note that, as shown in FIG. 8, another metal layer 40 (for example, Ni: 5000 Å) may be provided between the first metal layer 31 and the second metal layer 32.

Moreover, although not shown in FIG. 8, a copper (Cu) layer may be further provided as yet another metal layer. Accordingly, the multilayer metal structure on the second surface Sf2 includes Ti (500 Å), Ni (5000 Å), Cu (1500 Å) and Au (6000 Å) layers stacked in this order from the semiconductor substrate 10.

Since the thick metal layer TM, for example, Au has a low resistance value and a large thickness, a resistance Rb in a horizontal direction of the substrate can be reduced.

Furthermore, high corrosion resistance and oxidation resistance of Au can significantly suppress occurrence of defects such as discoloration and corrosion of the thick metal layer TM.

Figure 9:
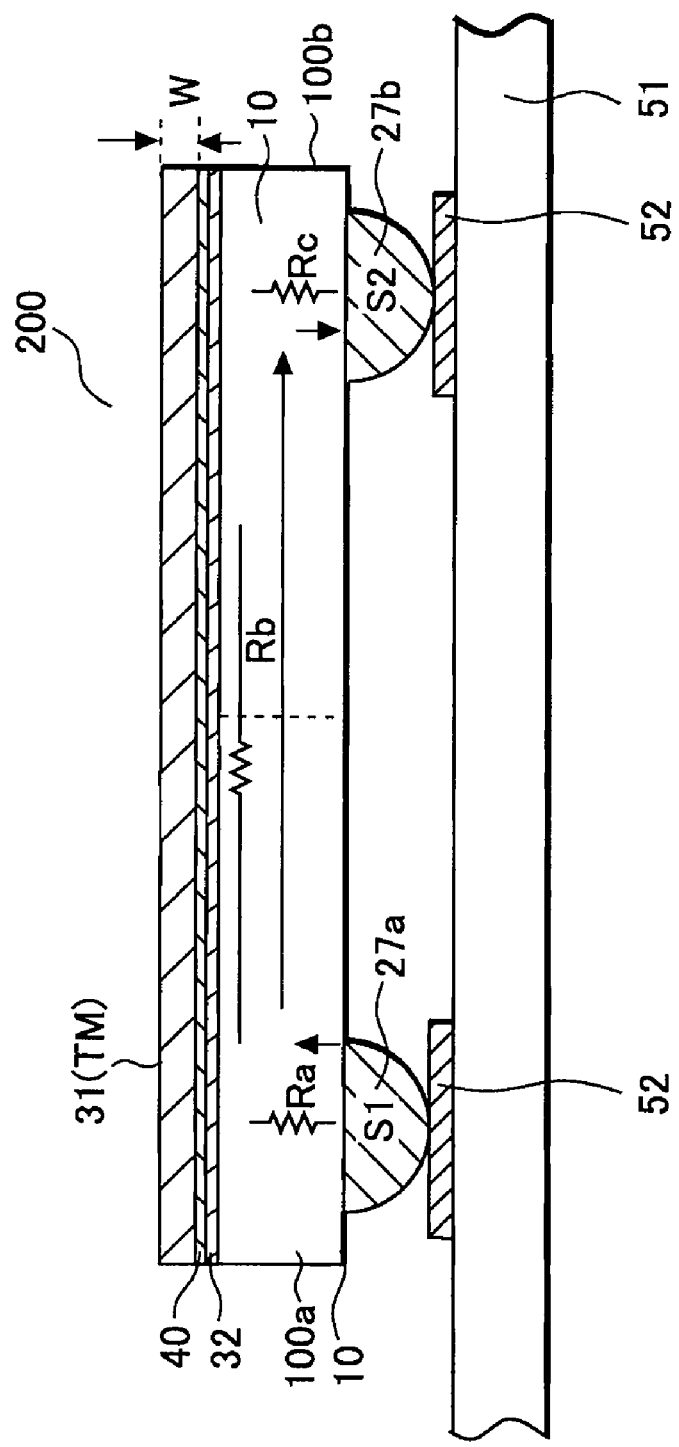
FIG. 9 is a side view showing the semiconductor device of the third embodiment of the present invention.

FIG. 9 is a side view showing an example of mounting the semiconductor substrate (semiconductor chip) 10 described above. After conductive patterns 52 are provided on a printed board 51 or the like, the semiconductor chip 10 is flip-chip mounted thereon.

Specifically, the first source bump electrode 27a, the first gate bump electrode 29a, the second source bump electrode 27b and the second gate bump electrode 29b are connected to the conductive patterns 52 corresponding thereto.

The thickness of the thick metal layer TM provided above the second surface Sf2 has a correlation with on-resistances of the first and second MOSFETs 100a and 100b (to be described later). Moreover, in the correlation, there exists a thickness W of the thick metal layer TM, at which reduction in the on-resistance is saturated. Therefore, the thickness W of the thick metal layer TM is set around a lower limit at which reduction in the on-resistance is saturated. Thus, a cost increase can be suppressed.

For example, in the third embodiment, when a chip size is 1.8 mm×1.8 mm, the thickness W of the thick metal layer TM is 6000 Å.

In the first and second embodiments, the description was given of the case where the first and second electrodes are disposed above the same first surface Sf1 in order to realize the flip-chip mounting or mounting by use of the COB technology.

Meanwhile, the third embodiment achieves the structure in which no drain electrode is extended to the outside, and the first electrode (the first source electrode 17a) and the second electrode (the second source electrode 17b) on the current path are provided above the first surface Sf1 (see FIG. 8). Specifically, the structure of the third embodiment is not limited by a mounting method. For example, although not shown in the drawings, a general mold packaging method or the like is also adopted, in which the second surface Sf2 side of the semiconductor substrate 10 is fixed to a lead frame, and the lead frame and the semiconductor chip 10 are covered with a resin layer.

In the third embodiment, the on-resistance of the semiconductor device can be reduced by the thick metal layer TM provided above the second surface Sf2 of the semiconductor substrate 10.

Figure 10:
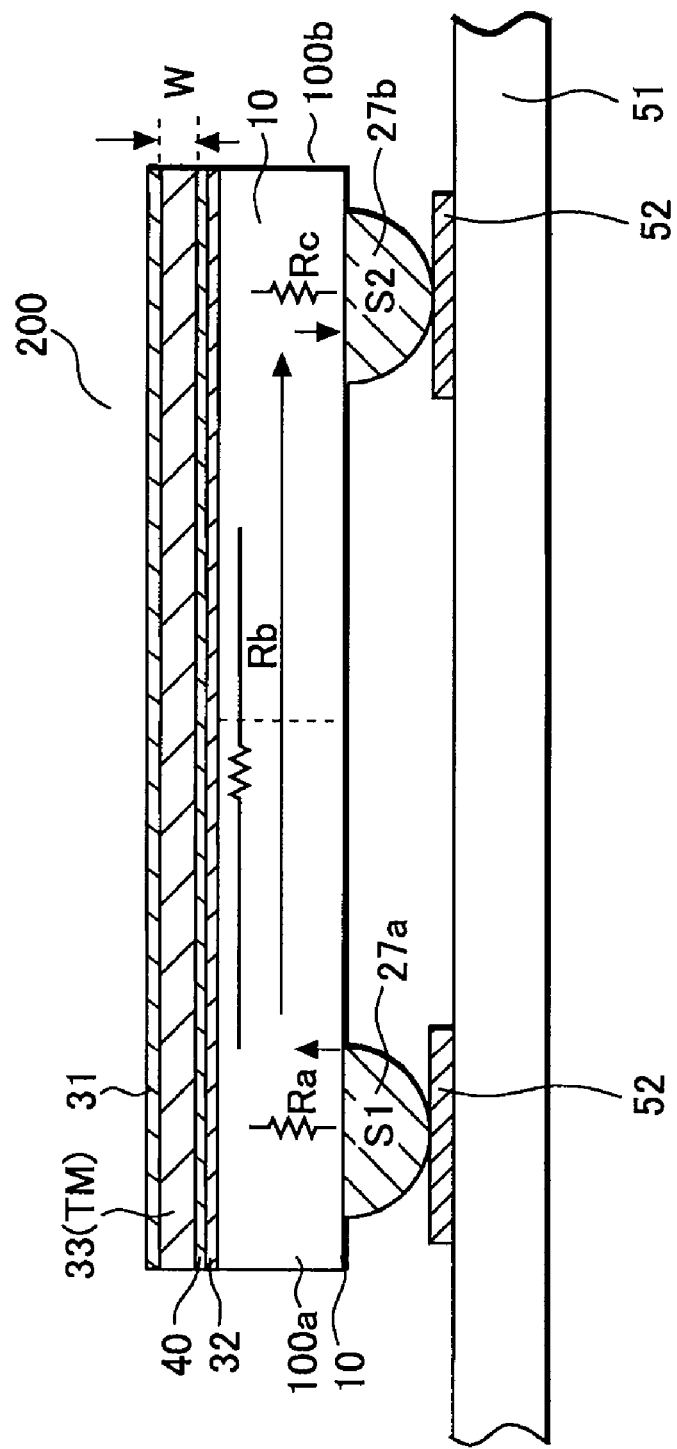
FIG. 10 is a side view showing a semiconductor device of a fourth embodiment of the present invention.

With reference to FIG. 10, a fourth embodiment of the present invention will be described. The fourth embodiment is the case where a third metal layer 33 is provided in the third embodiment. Since element regions 20a and 20b are the same as those in the third embodiment, illustration and description thereof will be omitted. Moreover, the same constituent components as those shown in FIG. 9 are denoted by the same reference numerals.

In the fourth embodiment, a first metal layer 31, a second metal layer 32 and a thick metal layer TM as the third metal layer 33 are provided above a second surface Sf2 of a semiconductor substrate 10. Specifically, the second metal layer 32 (for example, Ti: 500 Å) for improving adhesion is provided on the second surface Sf2 of the semiconductor substrate 10. Thereafter, the first metal layer 31 exposed to the uppermost surface of the second surface Sf2 is provided. Subsequently, between the second metal layer 32 and the first metal layer 31, the third metal layer 33 is disposed and set to be the thick metal layer TM. Note that another metal layer 40 (for example, Ni: 5000 Å) may be provided between the second metal layer 32 and the third metal layer 33.

Since the thick metal layer TM, for example, Cu has a low resistance value and a large thickness, a resistance Rb in a horizontal direction of the substrate can be reduced.

The thickness of the thick metal layer TM has a correlation with on-resistances of first and second MOSFETs 100a and 100b (to be described later). Moreover, in the correlation, there exists a thickness W of the thick metal layer TM, at which reduction in the on-resistance is saturated. Therefore, the thickness W of the thick metal layer TM is set around a lower limit at which reduction in the on-resistance is saturated. Thus, a cost increase can be suppressed.

Moreover, the first metal layer 31 is provided on the uppermost surface of the second surface Sf2 and Au is adopted for the first metal layer. Thus, it is possible to reduce the resistance Rb in the horizontal direction of the substrate and to significantly suppress occurrence of defects such as discoloration and corrosion of the uppermost surface of the second surface Sf2.

Furthermore, even if the thickness of the first metal layer 31 (Au) to be the uppermost surface of the second surface Sf2 is reduced, the on-resistance can be reduced by the thick metal layer TM (the third metal layer 33). Thus, the cost increase can be avoided compared with the third embodiment.

Next, with reference to FIG. 11, description will be given of a relationship between the thickness of the thick metal layer TM and the resistance of the device.

Figure 11:
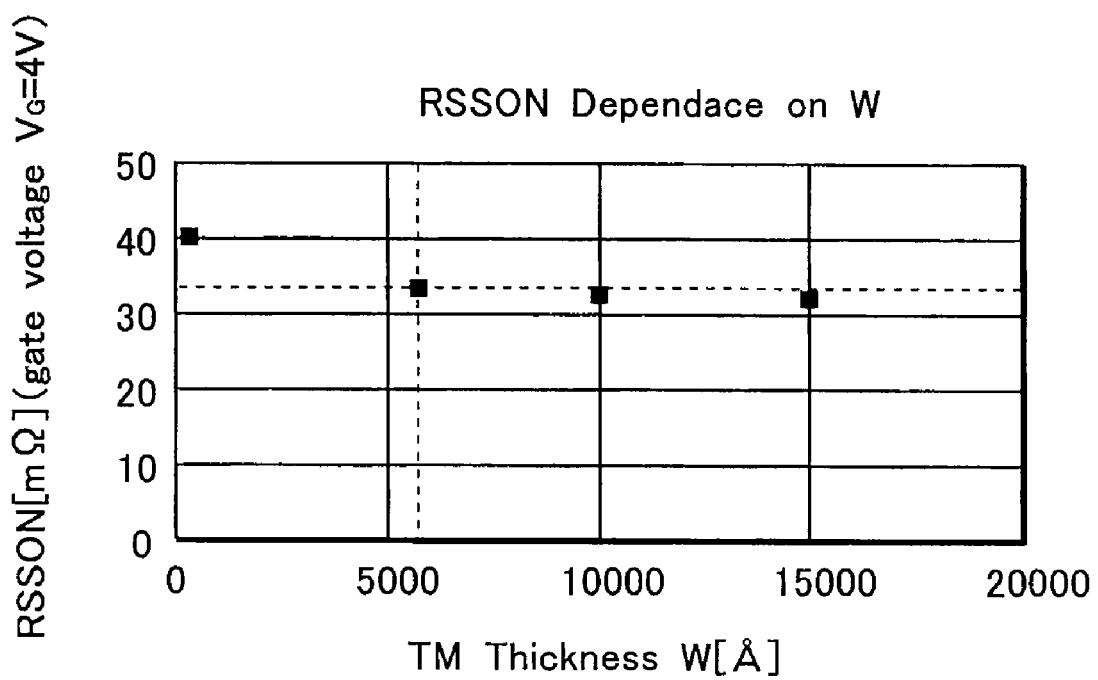
FIG. 11 is a characteristic diagram showing the semiconductor device of the embodiments of the present invention.
Figure 12:
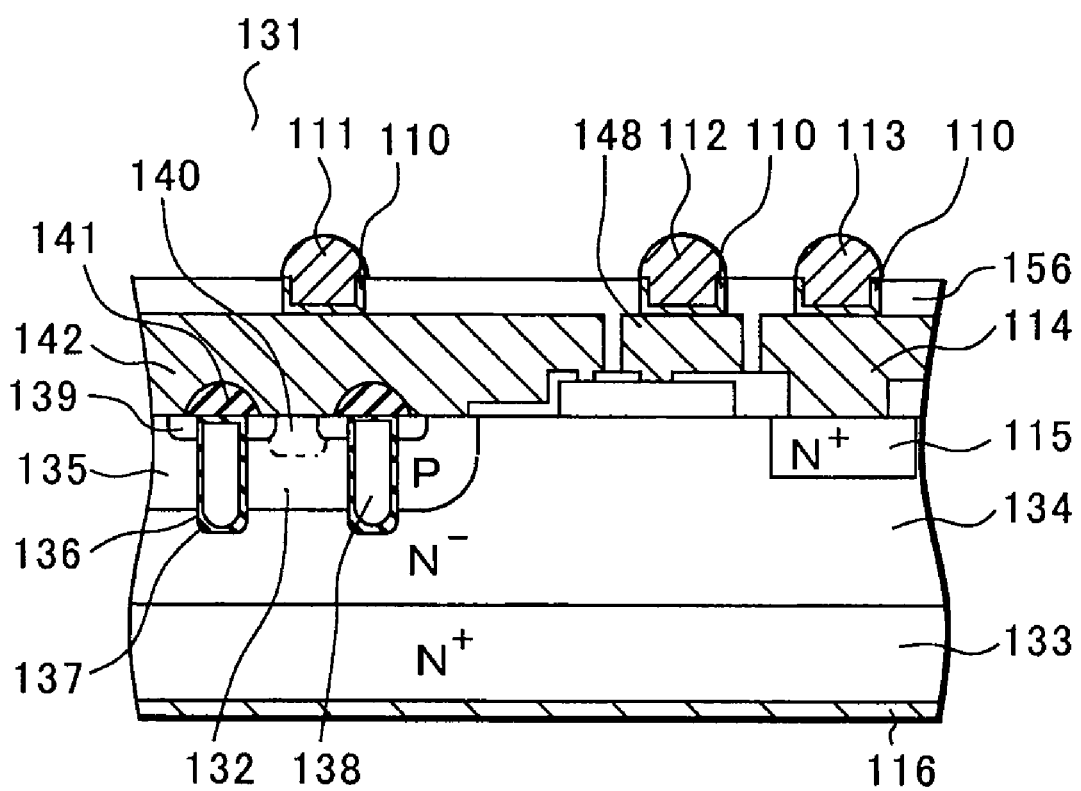
FIG. 12 is a cross-sectional view showing a conventional semiconductor device.

FIG. 11 shows a relationship between the thickness W of the thick metal layer TM and the on-resistance (RSSON) of the MOSFET in the third embodiment. The horizontal axis indicates the thickness W (Å) of the thick metal layer TM provided above the second surface Sf2 of the actual semiconductor substrate (semiconductor chip) 10 in the case where the first metal layer 31 (Au) is set to be the thick metal layer TM. Moreover, the vertical axis indicates the on-resistance RSSON (Ω) when a gate voltage $V_G$=4V. The semiconductor chip 10 has a size of 1.8 mm×1.8 mm.

The resistances Ra, Rb and Rc generated in the current path described above directly affect the on-resistance RSSON of the MOSFET. Specifically, when the resistances Ra, Rb and Rc are large, the on-resistance of the MOSFET is also increased.

Consequently, the on-resistance of the MOSFET can be reduced by providing the thick metal layer TM (Au) having a low resistance value of the second surface Sf2 to be the rear surface of the semiconductor chip 10.

However, it is found out that when the thickness of the thick metal layer TM (Au) exceeds a certain value, reduction in the on-resistance is set in a saturated state, as shown in FIG. 11. This is because of the following reason. Specifically, although the resistance Rb in the horizontal direction of the substrate (chip) can be reduced by increasing the thickness of the thick metal layer TM, the resistances Ra and Rb in the vertical direction of the substrate still exist as the on-resistance of the MOSFET and are not changed.

Specifically, when the above chip size is adopted, about 6000 Å is sufficient as the thickness of the thick metal layer TM (Au). If reduction in the on-resistance no longer advances, it is not necessary to further increase the thickness of the thick metal layer TM. A too large thickness of the thick metal layer TM rather causes a problem.

For example, the thick metal layer TM having an unnecessarily large thickness obviously causes a cost increase. Particularly, when Au is adopted for the thick metal layer TM, the unnecessarily large thickness hinders cost reduction.

Moreover, a too large thickness (for example, 2 µm or more) of the thick metal layer 31 also causes a problem such as occurrence of warp and a tendency of accelerating abrasion of a blade in a dicing operation in an assembly step.

Consequently, in this embodiment, the thickness of the thick metal layer TM is set around the lower limit at which the resistance value is saturated in the correlation between the thickness of the thick metal layer TM and the resistance value of the current path (here, the on-resistance of the MOSFET).

Thus, it is possible to reduce the resistance value of the semiconductor device at low cost and to provide a semiconductor device having high reliability by improving corrosion resistance and oxidation resistance.

Note that, although FIG. 11 shows characteristics for one chip size, the same trend is also observed for other chip sizes. Specifically, there is a possibility that a saturation point at which the resistance value is saturated varies depending on the chip size. However, there exists a saturation point in the relationship between the on-resistance and the thickness W of the thick metal layer TM.

Specifically, the thickness W of the thick metal layer TM in these embodiments is not limited to the above value but is set around a lower limit of the saturation point in the correlation between the thickness W of the thick metal layer TM and the resistance value of the current path. Thus, a cost increase can be suppressed.

According to the embodiments of the present invention, first, in the semiconductor device in which the first and second electrodes are provided above the first surface and the current path that reaches the second electrode from the first electrode through the substrate is formed, a resistance component in a horizontal direction of the substrate can be reduced by providing the thick metal layer above the second surface.

Secondly, by adopting Au having high oxidation resistance and corrosion resistance as the first metal layer which is thick metal layer exposed to the uppermost surface of the second surface, discoloration, corrosion and the like of the metal on the rear surface (second surface) can be suppressed. In the case of flip-chip mounting, the first metal layer is exposed to outside air. Thus, there is a problem that the resistance value of the first metal layer is changed.

Moreover, discoloration of the metal layer also causes an operational problem such as occurrence of defects including chip scattering and the like in dicing.

However, in the embodiments of this invention, discoloration, corrosion and the like can be suppressed without covering the surface of the first metal layer with a protective film.

Thirdly, the thickness of the thick metal layer is set around a lower limit at which the resistance value is saturated in a relationship between the thickness of the thick metal layer and the resistance value (on-resistance) of the entire device.

Thus, a semiconductor device having high reliability can be provided while suppressing costs.

Fourthly, copper is adopted as the third metal layer provided above the second surface, and the third metal layer is set to be the thick metal layer. Moreover, gold is adopted as the first metal layer exposed to the uppermost surface of the second surface. Thus, the semiconductor device having high reliability can be provided while further suppressing costs.

What is claimed is:

1. A semiconductor device comprising:
a semiconductor substrate comprising a first surface and a second surface;
a discrete semiconductor element formed in the semiconductor substrate;
a first electrode and a second electrode that are disposed on the first surface and connected with the discrete semiconductor element;
a first metal layer formed on the second surface so as to form an uppermost layer covering the second surface; and
a second metal layer disposed between the first metal layer and the second surface of the semiconductor substrate,
wherein the semiconductor device comprises a current path configured so that a current flows from the first electrode to first and second metal layers through the semiconductor substrate, flows along the first and second metal layers, and flows from the first and second metal layers to the second electrode through the semiconductor substrate upon application of voltages to the first and second electrodes,
the first metal layer is thicker than the second metal layer, and
the first metal layer has a higher degree of corrosion resistance or oxidation resistance than the second metal layer.

2. A semiconductor device comprising:
a semiconductor substrate comprising a first surface and a second surface;
a discrete semiconductor element formed in the semiconductor substrate;
a first electrode and a second electrode that are disposed on the first surface and connected with the discrete semiconductor element;
a first metal layer formed on the second surface so as to form an uppermost layer covering the second surface;
a second metal layer disposed between the first metal layer and the second surface of the semiconductor substrate; and
a third metal layer disposed between the second metal layer and the first metal layer,
wherein the semiconductor device comprises a current path configured so that a current flows from the first electrode to first, second and third metal layers through the semiconductor substrate, flows along the first, second and third metal layers, and flows from the first, second and third metal layers to the second electrode through the semiconductor substrate upon application of voltages to the first and second electrodes,
the first metal layer is thinner than the third metal layer, and
the first metal layer has a higher degree of corrosion resistance or oxidation resistance than the third metal layer.

3. The semiconductor device of claim 1, wherein the first metal layer comprises gold.

4. A semiconductor device comprising:
a semiconductor substrate comprising a first surface and a second surface;
a discrete semiconductor element formed in the semiconductor substrate;
a first electrode and a second electrode that are disposed on the first surface and connected with the discrete semiconductor element;
a first metal layer formed on the second surface so as to form an uppermost layer covering the second surface;
a second metal layer disposed between the first metal layer and the second surface of the semiconductor substrate; and
a third metal layer disposed between the second metal layer and the first metal layer,
wherein a current path is configured to be formed between the first and second electrodes through the semiconductor substrate and the first, second and third metal layers upon application of voltages to the first and second electrodes,
the first metal layer is thinner than the third metal layer,
the first metal layer has a higher degree of corrosion resistance or oxidation resistance than the third metal layer, and
the first metal layer comprises gold, and the third metal layer comprises copper.

5. A semiconductor device comprising:
a semiconductor substrate comprising a first surface and a second surface;
a discrete semiconductor element formed in the semiconductor substrate;
a first electrode and a second electrode that are disposed on the first surface and connected with the discrete semiconductor element;
a first metal layer formed on the second surface so as to form an uppermost layer covering the second surface; and
a second metal layer disposed between the first metal layer and the second surface of the semiconductor substrate,
wherein a current path is configured to be formed between the first and second electrodes through the semiconductor substrate and the first and second metal layers upon application of voltages to the first and second electrodes,
the first metal layer is thicker than the second metal layer,
the first metal layer has a higher degree of corrosion resistance or oxidation resistance than the second metal layer, and
a thickness of the first metal layer corresponds to a saturation limit at which a resistance against the current path is no longer significantly reduced upon increasing the thickness of the first metal layer.

6. A semiconductor device comprising:
a semiconductor substrate comprising a first surface and a second surface;
a discrete semiconductor element formed in the semiconductor substrate;
a first electrode and a second electrode that are disposed on the first surface and connected with the discrete semiconductor element;
a first metal layer formed on the second surface so as to form an uppermost layer covering the second surface;
a second metal layer disposed between the first metal layer and the second surface of the semiconductor substrate; and
a third metal layer disposed between the second metal layer and the first metal layer,
wherein a current path is configured to be formed between the first and second electrodes through the semiconductor substrate and the first, second and third metal layers upon application of voltages to the first and second electrodes,
the first metal layer is thinner than the third metal layer, the first metal layer has a higher degree of corrosion resistance or oxidation resistance than the third metal layer, and a thickness of the third metal layer corresponds to a saturation limit at which a resistance against the current path is no longer significantly reduced upon increasing the thickness of the third metal layer.

7. The semiconductor device of claim 1, wherein a thickness of the first metal layer is 5000 Å to 20000 Å.

8. The semiconductor device of claim 2, wherein a thickness of the third metal layer is 5000 Å to 20000 Å.

9. The semiconductor device of claim 1, wherein the discrete semiconductor element comprises a field-effect transistor, a bipolar transistor or a diode.

10. The semiconductor device of claim 2, wherein the discrete semiconductor element comprises a field-effect transistor, a bipolar transistor or a diode.

11. A semiconductor device comprising:
a semiconductor substrate comprising a first surface and a second surface;
a first discrete semiconductor element of insulating gate type formed in the semiconductor substrate;
a second discrete semiconductor element of insulating gate type formed in the semiconductor substrate;
a drain region that is part of the substrate and operates as a drain common to the first and second discrete semiconductor elements;
a first source electrode and a second source electrode that are disposed on the first surface and connected with the first and second discrete semiconductor elements, respectively;
a first metal layer formed on the second surface so as to form an uppermost layer covering the second surface; and
a second metal layer disposed between the first metal layer and the second surface of the semiconductor substrate,
wherein the semiconductor device comprises a current path configured so that a current flows from the first source electrode to first and second metal layers through the semiconductor substrate, flows along the first and second metal layers, and flows from the first and second metal layers to the second source electrode through the semiconductor substrate upon application of voltages to the first and second electrodes,
the first metal layer is thicker than the second metal layer, and
the first metal layer has a higher degree of corrosion resistance or oxidation resistance than the second metal layer.

12. A semiconductor device comprising:
a semiconductor substrate comprising a first surface and a second surface;
a first discrete semiconductor element of insulating gate type formed in the semiconductor substrate;
a second discrete semiconductor element of insulating gate type formed in the semiconductor substrate;
a drain region that is part of the substrate and operates as a drain common to the first and second discrete semiconductor elements;
a first source electrode and a second source electrode that are disposed on the first surface and connected with the first and second discrete semiconductor elements, respectively;
a first metal layer formed on the second surface so as to form an uppermost layer covering the second surface;
a second metal layer disposed between the first metal layer and the second surface of the semiconductor substrate; and
a third metal layer disposed between the second metal layer and the first metal layer,
wherein the semiconductor device comprises a current path configured so that a current flows from the first source electrode to first, second and third metal layers through the semiconductor substrate, flows along the first, second and third metal layers, and flows from the first, second and third metal layers to the second source electrode through the semiconductor substrate upon application of voltages to the first and second electrodes,
the first metal layer is thinner than the third metal layer, and
the first metal layer has a higher degree of corrosion resistance or oxidation resistance than the third metal layer.

13. The semiconductor device of claim 11, wherein the first metal layer comprises gold.

14. A semiconductor device comprising:
a semiconductor substrate comprising a first surface and a second surface;
a first discrete semiconductor element of insulating gate type formed in the semiconductor substrate;
a second discrete semiconductor element of insulating gate type formed in the semiconductor substrate;
a drain region that is part of the substrate and operates as a drain common to the first and second discrete semiconductor elements;
a first source electrode and a second source electrode that are disposed on the first surface and connected with the first and second discrete semiconductor elements, respectively;
a first metal layer formed on the second surface so as to form an uppermost layer covering the second surface;
a second metal layer disposed between the first metal layer and the second surface of the semiconductor substrate; and
a third metal layer disposed between the second metal layer and the first metal layer,
wherein a current path is configured to be formed between the first and second source electrodes through the semiconductor substrate and the first, second and third metal layers upon application of voltages to the first and second source electrodes,
the first metal layer is thinner than the third metal layer,
the first metal layer has a higher degree of corrosion resistance or oxidation resistance than the third metal layer, and
the first metal layer comprises gold, and the third metal layer comprises copper.

15. The semiconductor device of claim 1, wherein a voltage applied to the first electrode is different from a voltage applied to the second electrode.

* * * * *